(12) United States Patent
Yamaura et al.

(10) Patent No.: US 9,544,478 B2
(45) Date of Patent: Jan. 10, 2017

(54) ROTARY DIAL APPARATUS, IMAGING APPARATUS-USE BODY AND IMAGING APPARATUS

(71) Applicant: Panasonic Intellectual Property Management Co., Ltd., Osaka (JP)

(72) Inventors: Hiroshi Yamaura, Chiba (JP); Koji Yasuda, Osaka (JP); Gaku Suzuki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/824,136

(22) Filed: Aug. 12, 2015

(65) Prior Publication Data

US 2016/0057321 A1    Feb. 25, 2016

(30) Foreign Application Priority Data

Aug. 21, 2014  (JP) ................. 2014-168152

(51) Int. Cl.

| H04N 5/225 | (2006.01) |
|---|---|
| H04N 5/232 | (2006.01) |
| G05G 1/015 | (2008.04) |
| H01H 19/00 | (2006.01) |
| H03K 17/97 | (2006.01) |
| G03B 17/08 | (2006.01) |
| H01H 3/40 | (2006.01) |

(52) U.S. Cl.
CPC .......... *H04N 5/2251* (2013.01); *G05G 1/015* (2013.01); *H01H 19/001* (2013.01); *H03K 17/97* (2013.01); *H04N 5/23245* (2013.01); *G03B 17/08* (2013.01); *G03B 2217/002* (2013.01); *H01H 3/40* (2013.01); *H03K 2217/94068* (2013.01)

(58) Field of Classification Search
CPC .. H04N 5/2251; H04N 5/23245; H03K 17/97; H03K 2217/94068; G05G 1/015; H01H 19/001; H01H 3/40; G03B 2217/002; G03B 17/08

See application file for complete search history.

(56) References Cited

U.S. PATENT DOCUMENTS

| 4,687,308 A * | 8/1987 | Someya ................. | G03B 17/18 396/299 |
|---|---|---|---|
| 5,726,649 A * | 3/1998 | Tamaru ................. | G09B 5/065 200/526 |
| 6,088,531 A * | 7/2000 | Endoh ................... | G03B 17/08 396/29 |

(Continued)

FOREIGN PATENT DOCUMENTS

| JP | 8-077694 | 3/1996 |
|---|---|---|
| JP | 2010-282915 | 12/2010 |

*Primary Examiner* — Aung S Moe
(74) *Attorney, Agent, or Firm* — Wenderoth, Lind & Ponack, L.L.P.

(57) ABSTRACT

The rotary dial apparatus of the present disclosure includes: a housing; a dial being rotatably held relative to the housing; a magnet rotating in accordance with rotation of the dial; and a magnetic sensor disposed in the housing and detecting rotation of the magnet. The magnet and the magnetic sensor are disposed in different regions from each other with a wall being interposed between the magnet and the magnetic sensor.

6 Claims, 11 Drawing Sheets

(56) References Cited

U.S. PATENT DOCUMENTS

| | | | | |
|---|---|---|---|---|
| 6,999,675 | B2* | 2/2006 | Nishiwaki | G03B 17/02 |
| | | | | 200/16 C |
| 2005/0067264 | A1* | 3/2005 | Kawamura | H01H 25/008 |
| | | | | 200/14 |
| 2006/0042921 | A1* | 3/2006 | Saitoh | H03K 17/968 |
| | | | | 200/302.2 |
| 2008/0048654 | A1* | 2/2008 | Takahashi | G01D 5/145 |
| | | | | 324/207.25 |
| 2010/0200375 | A1* | 8/2010 | Han | B62D 1/046 |
| | | | | 200/61.54 |
| 2012/0260763 | A1* | 10/2012 | Terao | G05G 1/08 |
| | | | | 74/507 |
| 2014/0072294 | A1* | 3/2014 | Himeno | H03K 17/78 |
| | | | | 396/543 |
| 2014/0374228 | A1* | 12/2014 | Park | H01H 19/11 |
| | | | | 200/336 |

* cited by examiner

FIG. 10

| Output of first magnetic sensor before rotation | Output of XOR circuit | Output of first magnetic sensor after rotation | Rotation direction detection | State transition |
|---|---|---|---|---|
| High | High | High | Counter-clockwise | B→A |
| High | High | Low | Clockwise | B→C |
| High | Low | High | Clockwise | A→B |
| High | Low | Low | Counter-clockwise | A→D |
| Low | High | High | Clockwise | D→A |
| Low | High | Low | Counter-clockwise | D→C |
| Low | Low | High | Counter-clockwise | C→B |
| Low | Low | Low | Clockwise | C→D |

ROTARY DIAL APPARATUS, IMAGING APPARATUS-USE BODY AND IMAGING APPARATUS

BACKGROUND OF THE INVENTION

1. Field of the Invention

The present disclosure relates to a rotary dial apparatus that can be disposed in an electronic device such as a digital camera.

2. Description of the Related Art

Patent Literature 1 discloses an operation member that allows the user to set an arbitrary number of pulses generated by a rotary encoder per rotation of a knob, and to instruct execution of any process such as reproduction of a selected music piece. The operation member is integrally disposed with the knob.

CITATION LIST

Patent Literature

PTL 1: Unexamined Japanese Patent Publication No. H8-77694

SUMMARY OF THE INVENTION

The present disclosure provides a rotary dial apparatus that exhibits high drip-proof performance.

The rotary dial apparatus of the present disclosure includes: a housing; a dial being rotatably held relative to the housing; a magnet rotating in accordance with rotation of the dial; and a magnetic sensor disposed in the housing and detecting rotation of the magnet. The magnet and the magnetic sensor are disposed in different regions from each other with a wall being interposed between the magnet and the magnetic sensor.

The present disclosure can implement a rotary dial apparatus that exhibits high drip-proof performance.

BRIEF DESCRIPTION OF DRAWINGS

FIG. 10 is a table of rotation direction detection by the control unit; and

DETAILED DESCRIPTION OF THE PREFERRED EMBODIMENTS

Hereinafter, exemplary embodiments will be described in detail with reference to the drawings as appropriate. Note that, an unnecessarily detailed description may be omitted. For example, a detailed description of an already well-known matter may be omitted and a description of a substantially identical structure may not be repeated. This is to avoid unnecessary redundancy in the following description and to facilitate understanding by a person skilled in the art.

Note that, the accompanying drawings and the following description are provided for the purpose of allowing a person skilled in the art to fully understand the present disclosure, and they are not intended to limit the subject as defined by the claims.

Further, in the following exemplary embodiments, a digital camera will be described as an exemplary device having installed a rotary dial apparatus according to the present disclosure. The digital camera is an exemplary imaging apparatus.

1. FIRST EXEMPLARY EMBODIMENT

Figure 1:
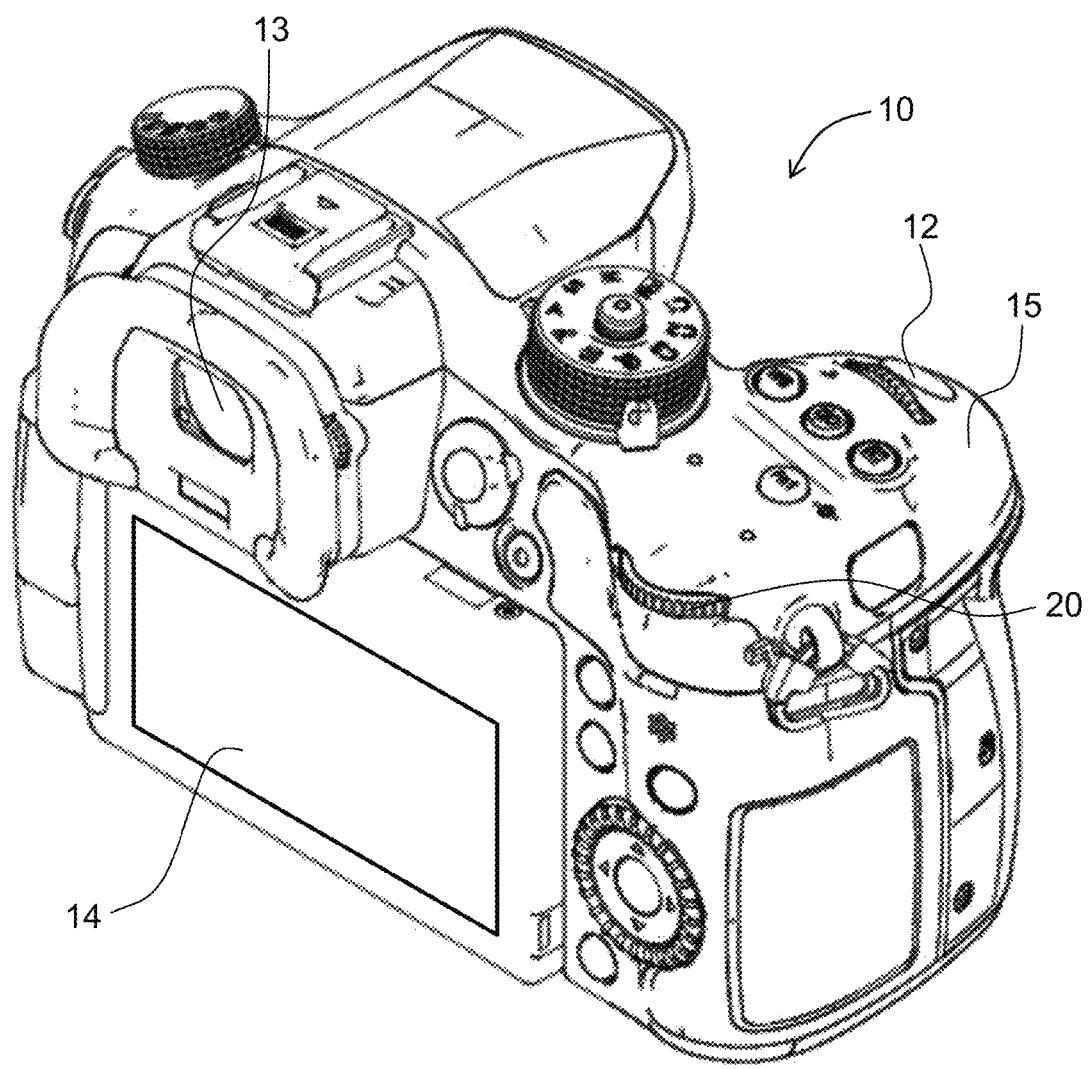
FIG. 1 is a rear perspective view of a camera body according to a first exemplary embodiment.

FIG. 1 is a rear perspective view of a digital camera. FIG. 1 shows camera body 10 and does not show an interchangeable lens. Camera body 10 includes a body mount, release button 12, EVF (electric viewfinder) 13, monitor 14, case 15, and rotary dial unit 20. Camera body 10 is an exemplary imaging apparatus main body.

In the following description, the top side of the digital camera is referred to as top (on), and the opposite side is referred to as bottom (under). Further, in the following description, the side of the digital camera toward the object is referred to as front (forward), and the side toward the camera user is referred to as rear (backward).

The body mount mechanically and electrically connects an interchangeable lens to camera body 10. The body mount has an electrical connection for connecting to the interchangeable lens, and is configured to allow communication between camera body 10 and the interchangeable lens. Release button 12 is a two-stage push button that enters a half-push state and a full-push state. When release button 12 is half-pushed by the user, the digital camera determines capturing conditions. Subsequently, when release button 12 is full-pushed by the user, the digital camera carries out a capturing process. At the full-push timing, the digital camera records, on a memory card or the like as a still image, image data that is formed on an imaging element through the interchangeable lens.

EVF 13 is a device that displays the image or the like acquired by the imaging element. Near EVF 13, an eyepiece sensor is provided. The digital camera selects whether to display the image on EVF 13 or on monitor 14 depending on a detection result of the eyepiece sensor.

Monitor 14 is a device that displays the image or the like acquired by the imaging element. Monitor 14 and EVF 13 can display capturing conditions such as a shutter speed, an aperture value and the like, in addition to the image acquired by the imaging element.

On an outer circumferential surface of or inside case 15, elements of camera body 10 are held. Case 15 is an exemplary housing. Case 15 is molded by metal or resin, and prevents intrusion of water or dust on camera body 10.

Rotary dial unit 20 is a rotary operation system that is disposed on a rear surface of camera body 10. Rotary dial unit 20 is rotary operation means for adjusting the shutter speed, the aperture value and the like. The user can set desired shutter speed or aperture value by rotating rotary dial unit 20. Rotary dial unit 20 according to the present exemplary embodiment is also referred to as a rear dial. The rotation direction and the rotation amount of rotary dial unit 20 are detected by rotation detector 30 (see FIGS. 2 and 3).

1-1. Structure

Figure 2:
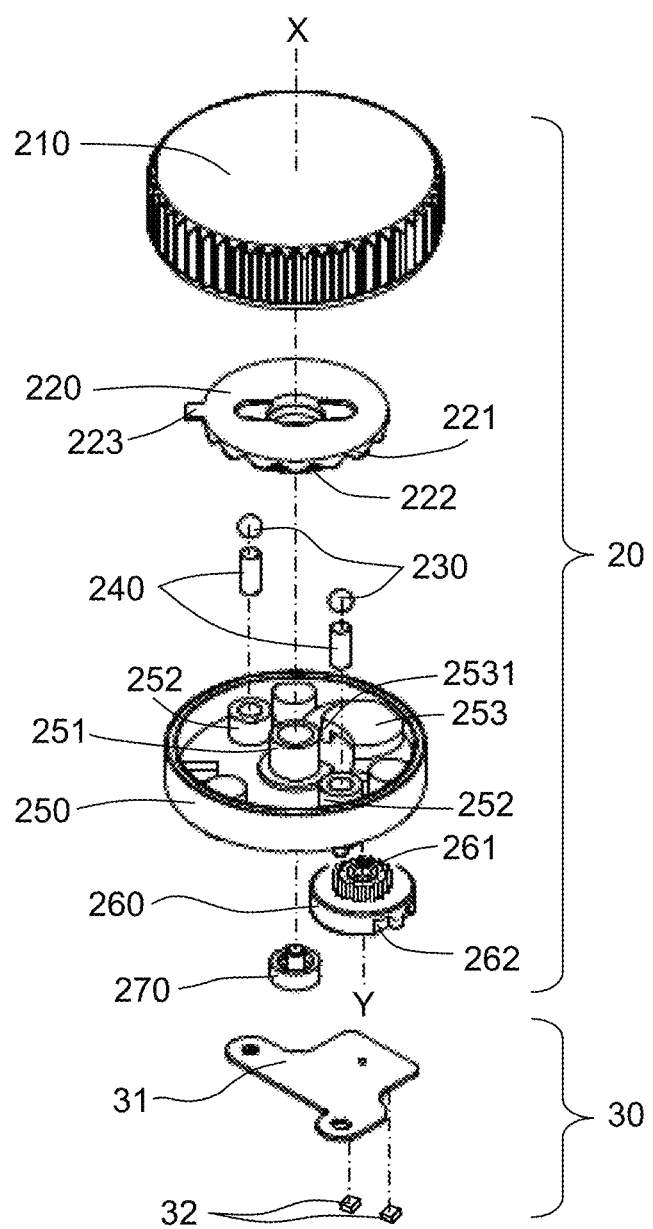
FIG. 2 is an exploded perspective view of a rotary dial apparatus of the camera body according to the first exemplary embodiment.

FIG. 2 is an exploded perspective view of rotary dial unit 20 and rotation detector 30. Rotary dial unit 20 includes dial 210, click plate 220, click balls 230, click springs 240, dial holder 250, magnet holder 260, and pull-out stopper 270. Rotation detector 30 includes substrate 31 and magnetic sensors 32.

Firstly, a description will be given of the constituting elements of rotary dial unit 20 and those of rotation detector 30. Dial 210 is formed into a substantially cylindrical shape. Under dial 210, a protrusion (shaft) that is inserted into dial bearing 251 of dial holder 250 is formed. Dial 210 is rotatable about rotation axis X relative to dial holder 250. A plurality of protrusions are formed on an outer circumferential surface of dial 210, to prevent the user's hand from slipping in rotating rotary dial unit 20.

Click plate 220 is a plate-like member made of metal or the like. Along a circumference of click plate 220, click grooves 221 are formed. Click grooves 221 have a smooth uneven shape. Under click plate 220, first gear 222 is held. First gear 222 rotates about rotation axis X integrally with dial 210. Along the circumference of click plate 220, positioning protrusion 223 is formed. Positioning protrusion 223 engages with a groove inside dial 210. Note that, first gear 222 may be integrally formed with click plate 220.

Click balls 230 are each a sphere-like member. Click balls 230 are biased upward by click springs 240 in spring holders 252 formed at dial holder 250.

Click springs 240 are each an elastic member. Click springs 240 bias click balls 230 upward in spring holders 252 formed at dial holder 250.

Dial holder 250 is a substantially cylindrical member molded by resin or the like. Inside dial holder 250, dial bearing 251, spring holders 252, and gear bedplate 253 are formed. Dial bearing 251 is formed into a substantially hollow cylindrical shape. Into dial bearing 251, the shaft formed at dial 210 is inserted to be held by dial bearing 251. Spring holders 252 are each formed into a hollow cylindrical shape. Spring holders 252 hold click springs 240 and click balls 230 inside. Spring holders 252 are formed to have a height enough to hold click springs 240 and click balls 230. Thus, spring holders 252 prevent click balls 230 from escaping from spring holders 252. Gear bedplate 253 is formed into a substantially cylindrical shape inside dial holder 250, and holds magnet holder 260 rotatably about rotation axis Y. Gear bedplate 253 has cutaway portion 2531 at part of a surface facing dial bearing 251. Part of second gear 261, which will be described later, is exposed by cutaway portion 2531.

Magnet holder 260 is a substantially cylindrical member molded by resin or the like. Magnet holder 260 integrally holds second gear 261 on magnet holder 260. Magnet holder 260 integrally holds magnet 262 under magnet holder 260. Magnet 262 can be held by being bonded to magnet holder 260 through use of, for example, a double-sided tape. By second gear 261 rotating about rotation axis Y, magnet holder 260 and magnet 262 integrally rotate. A notch or the like is formed at a bottom of magnet holder 260, for positioning magnet 262. Note that, second gear 261 may be integrally formed with magnet holder 260.

Pull-out stopper 270 is a substantially cylindrical member having a recess at a center of pull-out stopper 270. After the recess formed at the center is engaged with the shaft of dial 210, pull-out stopper 270 is screwed from below.

On one side or both sides of substrate 31 of rotation detector 30, electric circuitry is formed. Substrate 31 holds two magnetic sensors 32 under substrate 31. Magnetic sensors 32 are sensors that measure the magnitude or direction of a magnetic field, and can be implemented by magnetoresistance elements or the like. On substrate 31, there is formed circuitry for transmitting, to a control unit of the digital camera, a detection signal acquired from magnetic sensors 32.

Next, a description will be given of a disposition relationship of the constituent elements. The shaft formed under dial 210 engages with dial bearing 251. Dial 210 is screwed to pull-out stopper 270 as being inserted into dial bearing 251. Thus, dial 210 is held rotatably relative to dial holder 250.

Dial 210 holds click plate 220. By positioning protrusion 223 fitting into the groove (not shown) formed at dial 210, click plate 220 and dial 210 are prevented from becoming out of phase between each other. That is, click plate 220 rotates integrally with dial 210 about rotation axis X.

Figure 3:
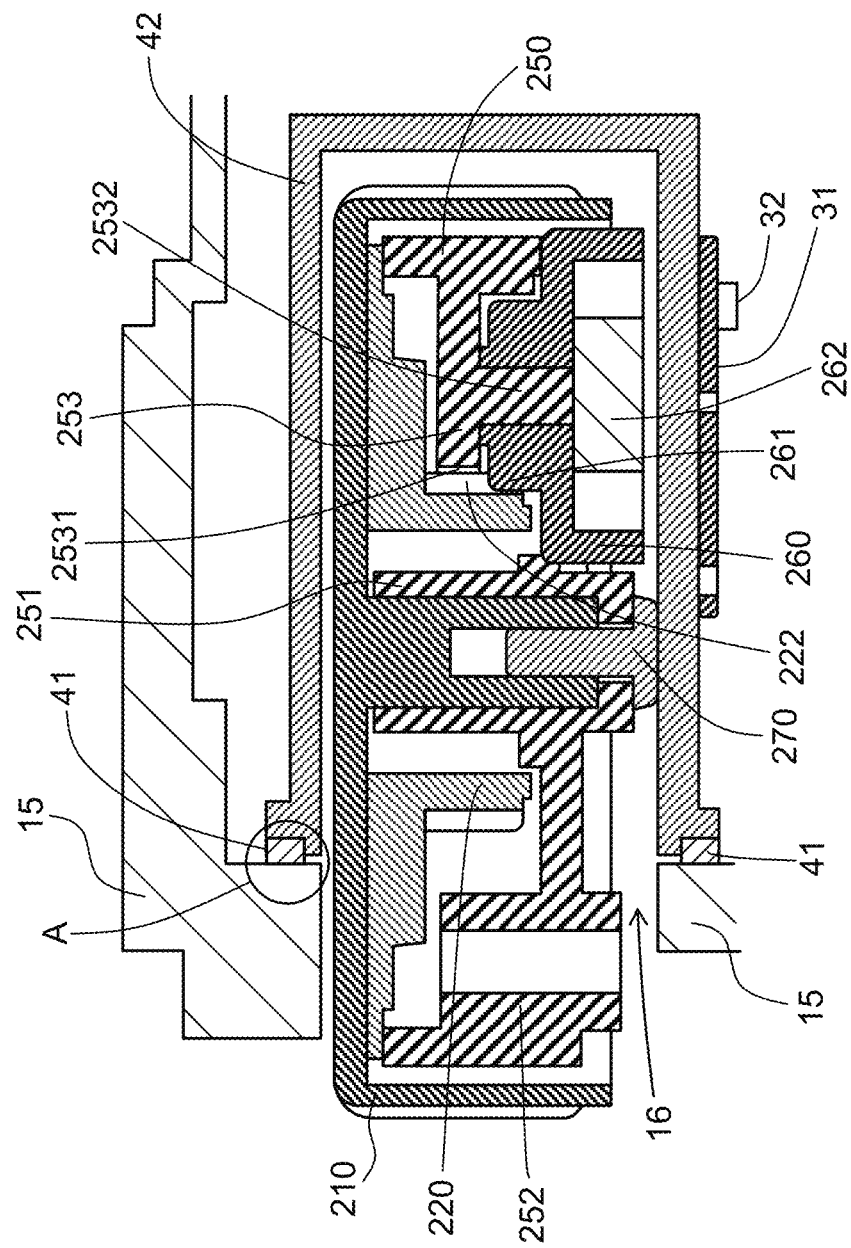
FIG. 3 is a cross-sectional view of the rotary dial apparatus according to the first exemplary embodiment.

Dial holder 250 is held at water shielding wall 42 (an exemplary wall) shown in FIG. 3 via pull-out stopper 270. This restricts rotation of dial holder 250 relative to water shielding wall 42.

Click balls 230 are biased upward by click springs 240, to be brought into contact with click grooves 221 formed at click plate 220. Click grooves 221 are formed into a smooth uneven shape. When the user rotates dial 210, click balls 230 shift over the grooves. This gives the user a click touch.

FIG. 3 is a cross-sectional view of the rotary dial apparatus according to the first exemplary embodiment.

Dial holder 250 includes gear bedplate 253. At gear bedplate 253, cutaway portion 2531 and gear rotation shaft 2532 are formed. Magnet holder 260 rotate about gear rotation shaft 2532 about rotation axis Y. At cutaway portion 2531, part of second gear 261 is exposed outside gear bedplate 253, whereby first gear 222 and second gear 261 mesh with each other. Thus, second gear 261 rotates as first gear 222 rotates.

Magnet holder 260 is rotatably held at dial holder 250. At the upper part of magnet holder 260, second gear 261 is formed. Magnet holder 260 integrally holds magnet 262. Thus, magnet 262 rotates as second gear 261 rotates.

Next, a description will be given of a disposition relationship of rotary dial unit 20, rotation detector 30, and camera body 10 (case 15, water shielding wall 42). In the following description, a region surrounded by water shielding wall 42 is referred to as a camera exterior, and a region not covered by water shielding wall 42 and covered by case 15 is referred to as a camera interior.

As shown in FIG. 3, at least part of cross section of water shielding wall 42 is inverted C-shaped. Case 15 has substantially rectangular opening 16. Water shielding wall 42 is disposed so as to cover opening 16 from inside case 15. Magnet 262 and magnetic sensors 32 are disposed in different regions from each other with water shielding wall 42 being interposed between rotary dial unit 20 and rotation detector 30. Water shielding wall 42 is screwed to case 15, with elastic member 41 being interposed between water shielding wall 42 and a circumference of opening 16 of case 15.

Figure 4:
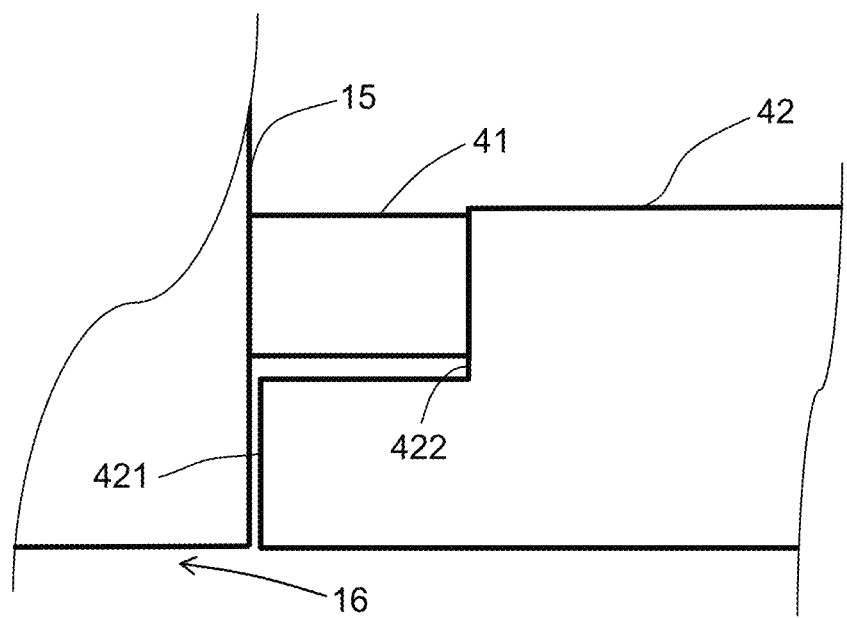
FIG. 4 is an enlarged view of part A in FIG. 3.

FIG. 4 is an enlarged view of part A in FIG. 3. FIG. 4 is a schematic diagram showing a state where water shielding wall 42 is held by case 15. Water shielding wall 42 has contact surface 421 and recessed surface 422 at an end that faces case 15 surrounding opening 16. Water shielding wall 42 is screwed to case 15 at contact surface 421 while compressing elastic member 41 by recessed surface 422. Thus, elastic member 41 prevents intrusion of water into the camera interior from the camera exterior. Rotary dial unit 20 is disposed at the camera exterior with water shielding wall 42 being interposed, and rotation detector 30 is disposed at camera interior with water shielding wall 42 being interposed. Thus, with water shielding wall 42 being interposed, rotation detector 30 which is required to possess high drip-proof performance as compared to rotary dial unit 20 can be disposed at the camera interior, and rotary dial unit 20 which is less influenced by intrusion of water can be disposed at the camera exterior.

That is, as shown in FIG. 3, the rotation detector 30 that requires electrical connection is disposed at the camera interior with water shielding wall 42 being interposed. Further, as shown in FIG. 4, since compressed elastic member 41 is interposed between water shielding wall 42 and case 15, intrusion of water on the conductive portion of rotation detector 30 can be prevented. Since rotary dial unit 20 disposed at the camera exterior does not have any conductive portion, the performance of rotary dial unit 20 is not significantly damaged by water intrusion. Accordingly, drip-proof performance around rotary dial unit 20 of the digital camera improves.

Figure 5A:
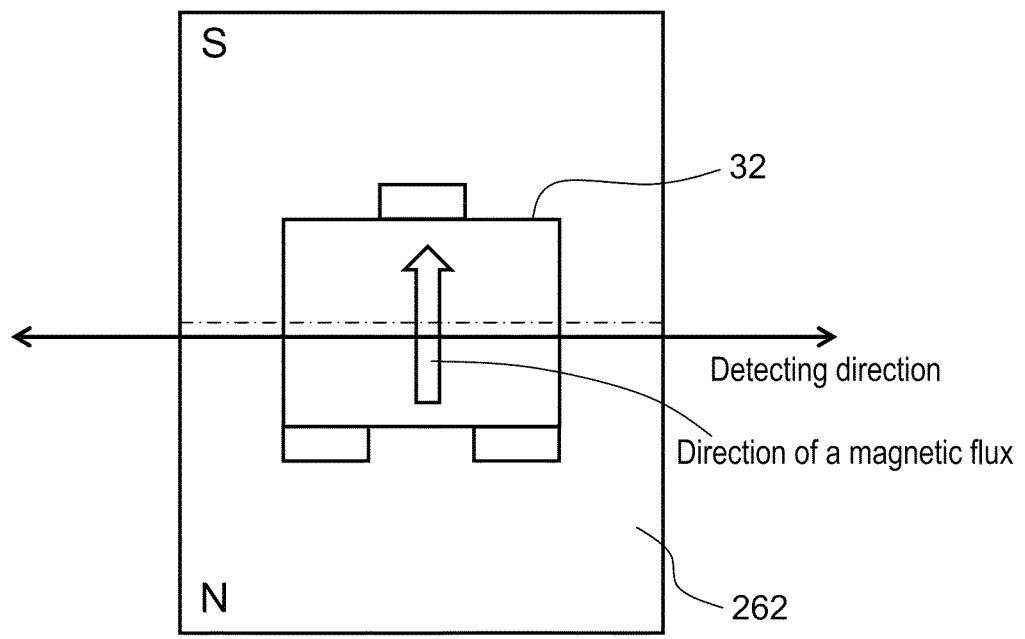
FIGS. 5A and 5B are each a schematic diagram for describing a general rotation detecting principle through use of magnetic sensors.
Figure 5B:
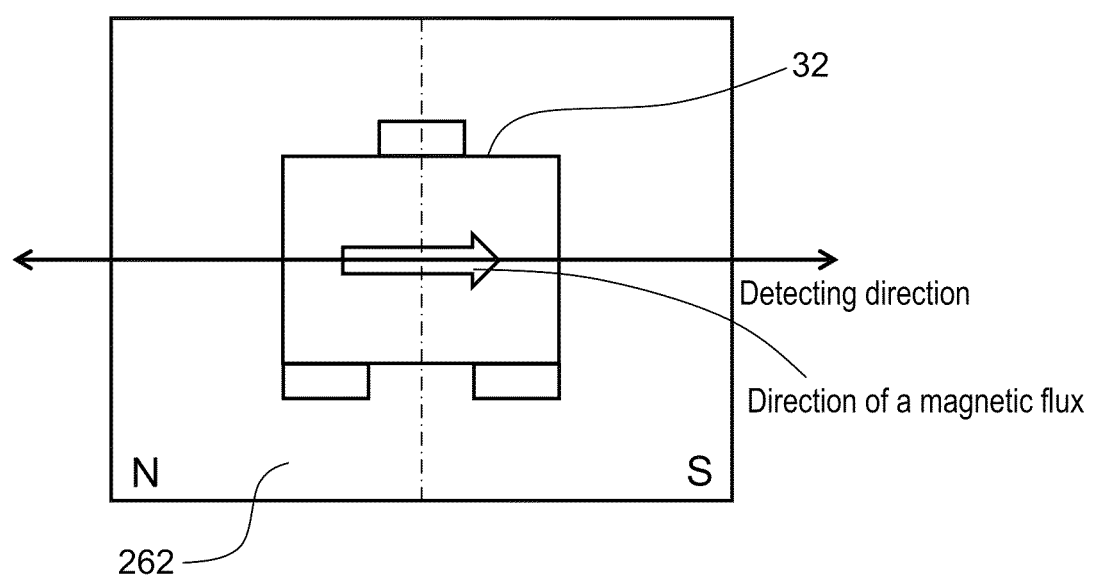

1-2. Operation 1-2-1. General Rotation Detecting Principle Through Use of Magnetic Sensors FIGS. 5A and 5B are each a schematic diagram for describing a general rotation detecting principle through use of magnetic sensors 32. There is a detecting direction with each of magnetic sensors 32. When a magnetic flux being parallel to the detecting direction is applied (FIG. 5B), magnetic sensor 32 provides an output. When a magnetic flux being perpendicular to the detecting direction is applied (FIG. 5A), magnetic sensor 32 provides no output. That is, single magnetic sensor 32 can only detect a difference in the direction of a magnetic flux in step of 90 degrees.

1-2-2. Acceleration Mechanism

Figure 6:
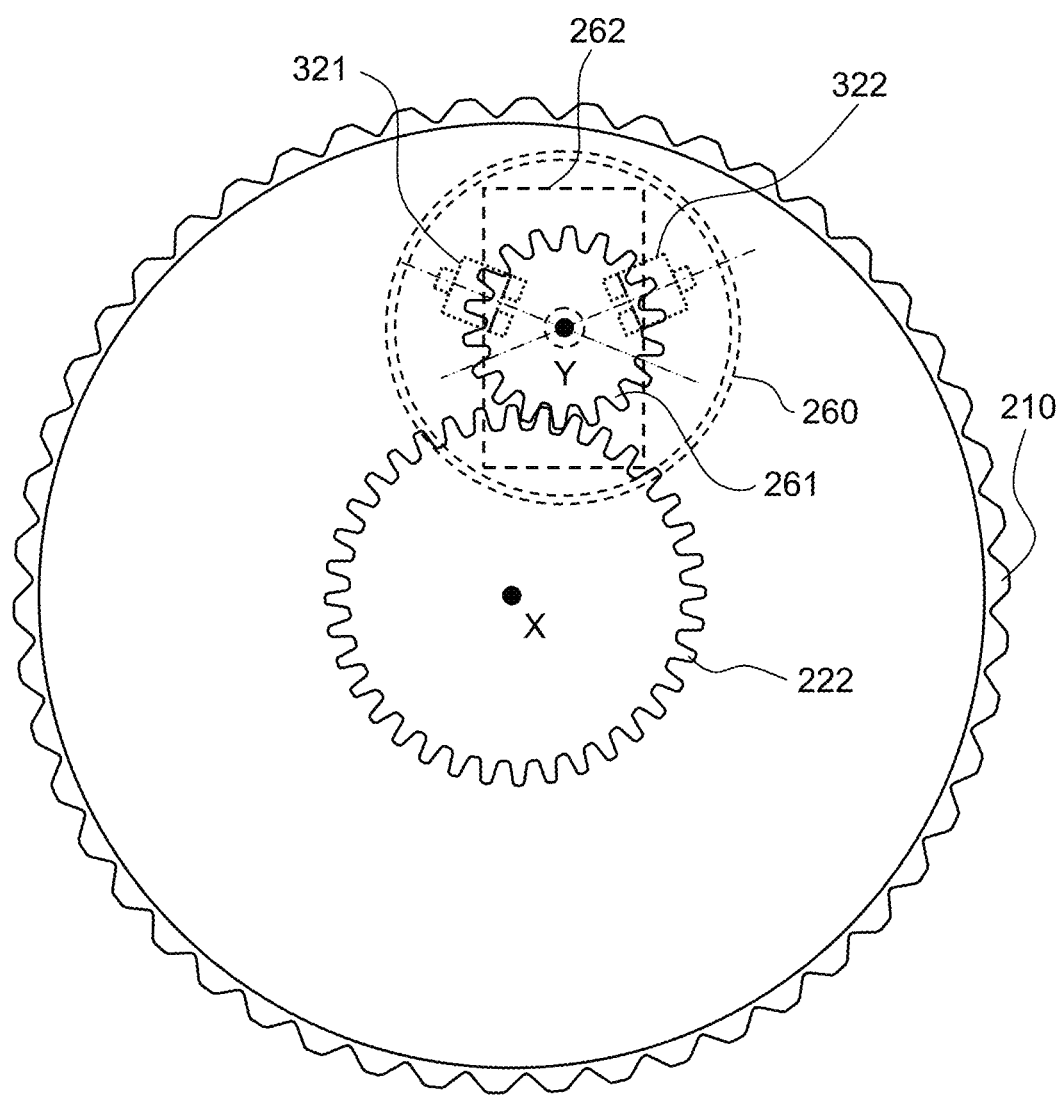
FIG. 6 is a schematic diagram for describing an acceleration mechanism and a method for detecting rotation of the rotary dial apparatus according to the first exemplary embodiment.

FIG. 6 is a top view for describing an acceleration mechanism and a method for detecting rotation of the rotary dial apparatus according to the first exemplary embodiment. In the present exemplary embodiment, as magnetic sensors 32, first magnetic sensor 321 and second magnetic sensor 322 are used. First magnetic sensor 321 and second magnetic sensor 322 are disposed at positions between which a central angle of 135 degrees is formed about rotation axis Y. That is, two lines respectively connecting between a center of first magnetic sensor 321 and rotation axis Y and between a center of second magnetic sensor 322 and rotation axis Y (dot-dash-lines in FIG. 6) form an inclination of 45 degrees. Accordingly, the detecting direction of first magnetic sensor 321 and the detecting direction of second magnetic sensor 322 are inclined by 45 degrees relative to each other. As described in 1-2-1 above, a difference in the direction of a magnetic flux that can be detected by single magnetic sensor is in step of 90 degrees. On the other hand, by inclining the detecting direction of first magnetic sensor 321 and that of second magnetic sensor 322 by 45 degrees, it becomes possible to detect the rotation of magnet 262 in step of 45 degrees.

Magnet 262 is integrally held by magnet holder 260. Second gear 261 formed at magnet holder 260 meshes with first gear 222 at a gear ratio of 1:2. That is, first gear 222 is twice as great as second gear 261 in a number of teeth. Thus, dial 210 integrally holding first gear 222 rotates by 22.5 degrees when magnet 262 rotates by 45 degrees. That is, as in the present structure, by disposing two magnetic sensors while inclining the detecting directions of the magnetic sensors by 45 degrees, rotation detector 30 can detect rotation of dial 210 by step of 22.5 degrees.

Further, in the present exemplary embodiment, as shown in FIGS. 2 and 3, since the rotation axis of first gear 222 and the rotation axis of second gear 261 are different, a thickness in the axis direction of rotary dial unit 20 can be reduced.

1-2-3. Rotation Detection Method

Figure 7:
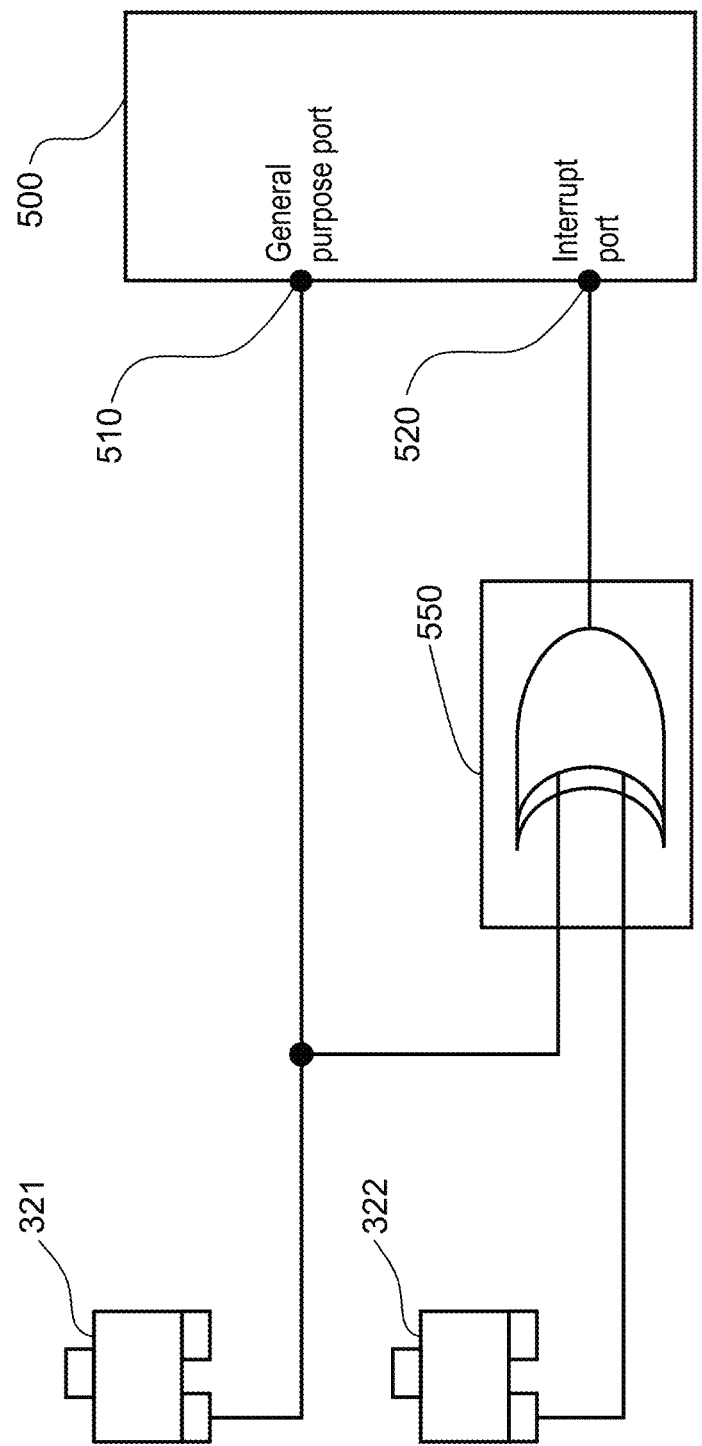
FIG. 7 is a circuit configuration diagram of major part of a rotation detector and a control unit according to the first exemplary embodiment.

FIG. 7 is a circuit diagram of major part for detecting rotation of the rotary dial apparatus according to the present exemplary embodiment.

Control unit 500 controls the entire operations of the digital camera. Control unit 500 has a plurality of ports for electrically connecting to constituent elements of the digital camera. Control unit 500 has general purpose port 510 and interrupt port 520. General purpose port 510 is generally used in providing or receiving information to and from the constituent elements of the digital camera. Control unit 500 performs a process, such as execution of a prescribed program, in response to information acquired from general purpose port 510. Interrupt port 520 is used for communicating information upon receipt of which a process must be performed on a priority basis by interrupting a normal program that is being executed by control unit 500. When control unit 500 receives information from interrupt port 520 during execution of a normal program, control unit 500 performs a process on a priority basis in response to the information received from interrupt port 520.

The outputs of first magnetic sensor 321 and second magnetic sensor 322 provided to rotation detector 30 are monitored by control unit 500 provided to digital camera. Here, in the case where the outputs of first magnetic sensor 321 and second magnetic sensor 322 are directly input to control unit 500, the rotation detection cannot be achieved unless the outputs of both the magnetic sensors are respectively input to interrupt ports. However, in order for all the outputs of a plurality of magnetic sensors 32 to be input to individual interrupt ports, a multitude of interrupt ports becomes necessary. Hence, freedom of design is impaired.

Accordingly, in the present exemplary embodiment, as shown in FIG. 7, the outputs of first magnetic sensor 321 and second magnetic sensor 322 are input to XOR circuit 550, and only an output of XOR circuit 550 is input to interrupt port 520. Further, the output of first magnetic sensor 321 is input also to general purpose port 510. Thus, control unit 500 can monitor the outputs of a plurality of magnetic sensors 32 through use of single interrupt port 520, to detect rotation.

Figure 8:
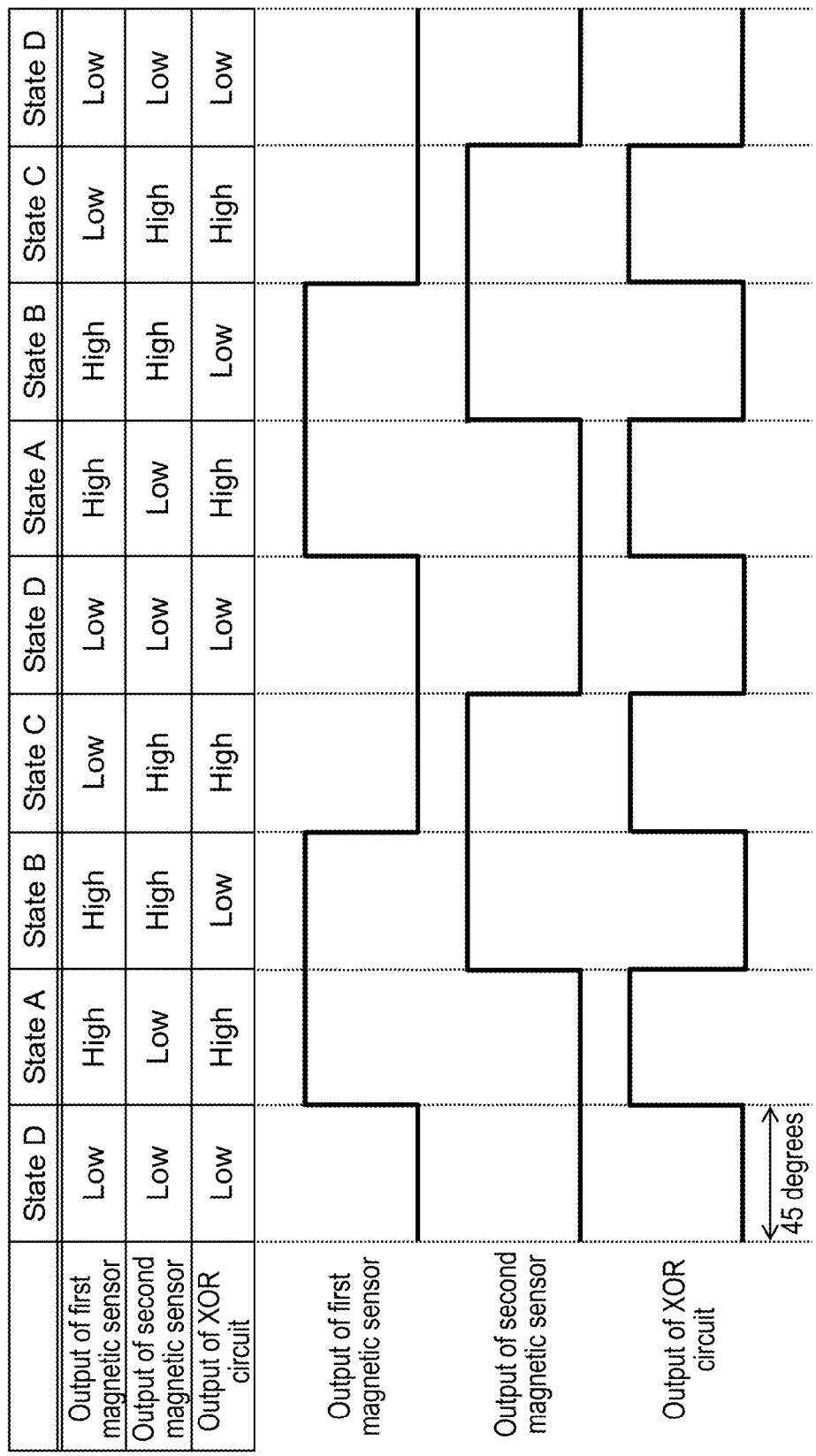
FIG. 8 is a diagram showing an overview of rotation detection by the control unit.

FIG. 8 shows the detection method through use of XOR circuit 550. As described above, an angle of rotation of the magnet that can be detected by a single magnetic sensor is 90 degrees. The output of first magnetic sensor 321 and the output of second magnetic sensor 322 switch to High and Low for each 90 degree-rotation of magnet 262. Here, when the output of magnetic sensors 32 is High, a magnetic flux of magnet 262 and the detecting direction of magnetic sensors 32 are in parallel to each other.

As shown in FIG. 6, first magnetic sensor 321 and second magnetic sensor 322 are disposed such that the detecting direction of first magnetic sensor 321 and the detecting direction of second magnetic sensor 322 are inclined by 45 degrees from each other about rotation axis Y. Accordingly, the outputs from magnetic sensors 32 are out of phase by 45 degrees as shown in FIG. 8. Thus, there exist four combinations of the outputs of first magnetic sensor 321 and second magnetic sensor 322, which are: a state where the output of first magnetic sensor 321 is High and the output of second magnetic sensor 322 is Low (state A); a state where the output of first magnetic sensor 321 is High and the output of second magnetic sensor 322 is High (state B); a state where the output of first magnetic sensor 321 is Low and the output of second magnetic sensor 322 is High (state C); and a state where the output of first magnetic sensor 321 is Low and the output of second magnetic sensor 322 is Low (state D).

XOR circuit 550 outputs High when the outputs of first magnetic sensor 321 and second magnetic sensor 322 are different (state A, state C); and outputs Low when the outputs of first magnetic sensor 321 and second magnetic sensor 322 are the same (state B, state D). Thus, since the output of XOR circuit 550 switches by 45 degrees, control unit 500 can detect the rotation of magnet 262 every 45 degrees.

Figure 9:
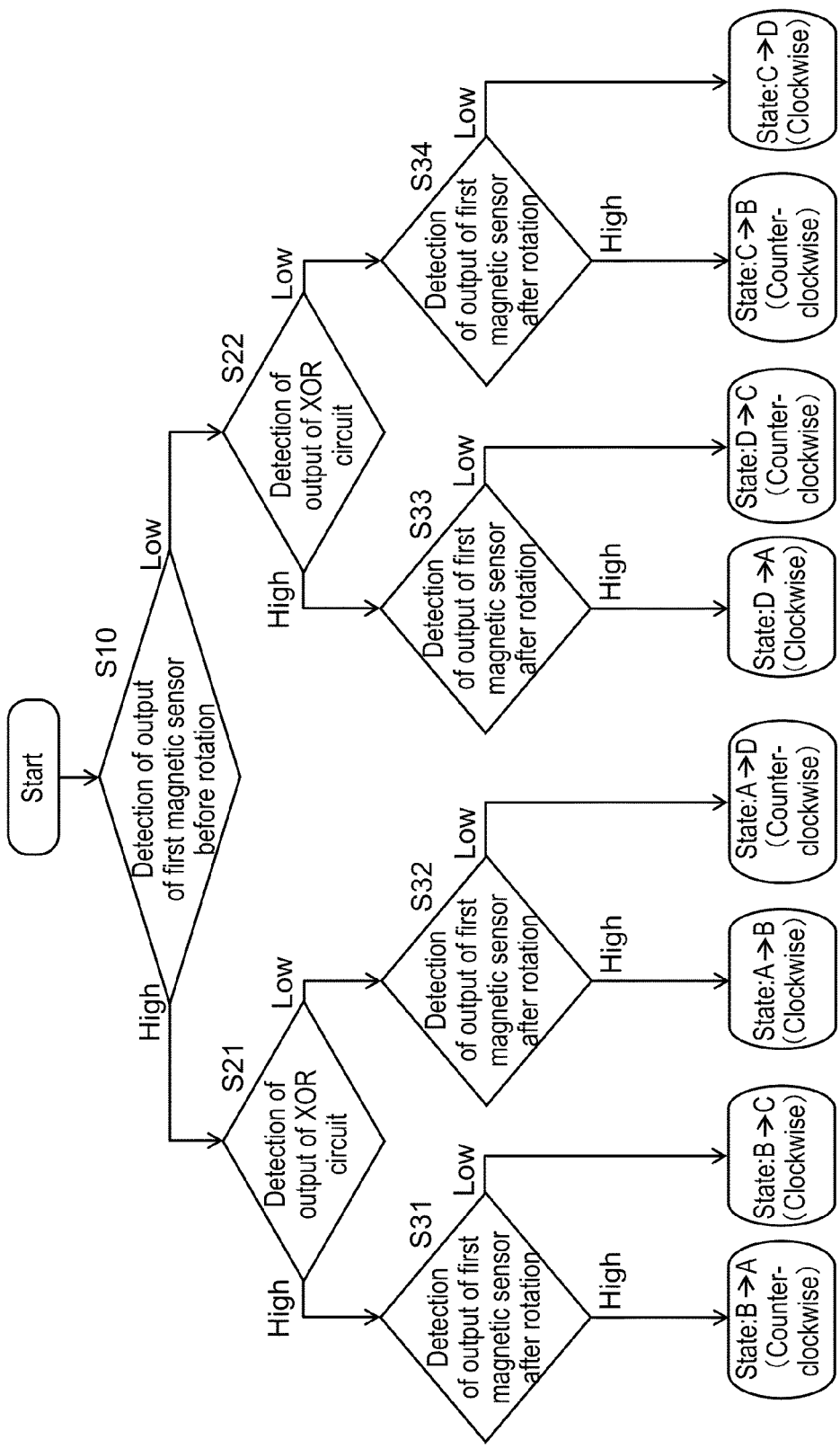
FIG. 9 is a flowchart of rotation direction detection by the control unit.

Next, a description will be given of the rotation direction detection method performed by control unit 500. FIG. 9 is a flowchart of control unit 500 detecting the rotation direction of magnet 262. FIG. 10 is a table of control unit 500 detecting the rotation direction of magnet 262.

When an interrupt signal is input to interrupt port 520 from XOR circuit 550, control unit 500 determines that magnet 262 has rotated, and detects the rotation direction of magnet 262 according to the flow of FIG. 9. Firstly, in Step S10, control unit 500 detects an output value of first magnetic sensor 321 before rotation detection. Next, in Steps S21 and S22, control unit 500 detects an output value of XOR circuit 550 based on the output value of first magnetic sensor 321 in Step S10. Further, as shown in Steps S31 to S34, control unit 500 detects an output value of first magnetic sensor 321 after rotation, based on the detected output value of XOR circuit 550 in Steps S21 and S22. In this manner, control unit 500 can detect whether magnet 262 has rotated clockwise or counter-clockwise.

In the following, a detailed description will be given of an exemplary case. It is assumed that, in Step S10, first magnetic sensor 321 outputs High before rotation. This shows that magnet 262 before rotation detection is in state A or state B. Next, it is assumed that, in Step S21, the output value of XOR circuit 550 after rotation is High. This shows that magnet 262 after rotation detection is in state A or state C. That is, whether transition from state B to state A or transition from state B to state C has occurred by the rotation of magnet 262 can be found. Next, it is assumed that first magnetic sensor 321 outputs High after rotation. This allows control unit 500 to specify that transition from state B to state A has occurred by the rotation of magnet 262. The same holds true for other cases. That is, by detecting an output value of first magnetic sensor 321 before rotation detection, an output value of XOR circuit 550 after rotation detection, and an output value of first magnetic sensor 321 after rotation detection, control unit 500 can specify transition of state caused by rotation of magnet 262, and detect the rotation direction of magnet 262.

Note that, in the exemplary case described above, control unit 500 detects an output value of first magnetic sensor 321 and an output value of XOR circuit 550 according to the flowchart of FIG. 9, and detects the rotation direction of magnet 262. However, the present disclosure is not limited thereto. In the flow, the detection order of information pieces is not limited. Alternatively, according to the table of FIG. 10, state transition and the rotation direction of magnet 262 may be uniquely detected from the entire information pieces including the output value of first magnetic sensor 321 before rotation detection, the output value of XOR circuit 550 after rotation detection, and the output value of first magnetic sensor 321 after rotation detection.

Further, in the exemplary case described above, control unit 500 detects rotation of magnet 262 using the detection values of first magnetic sensor 321 before and after rotation, in addition to the detection value of XOR circuit 550. However, the present disclosure is not limited thereto. Rotation of magnet 262 may be detected using detection values of second magnetic sensor 322 before and after rotation, in place of the detection values of first magnetic sensor 321 before and after rotation. Here, it is preferable that the output value of second magnetic sensor 322 is input to general purpose port 510.

2. SECOND EXEMPLARY EMBODIMENT 2-1. Structure

Figure 11:
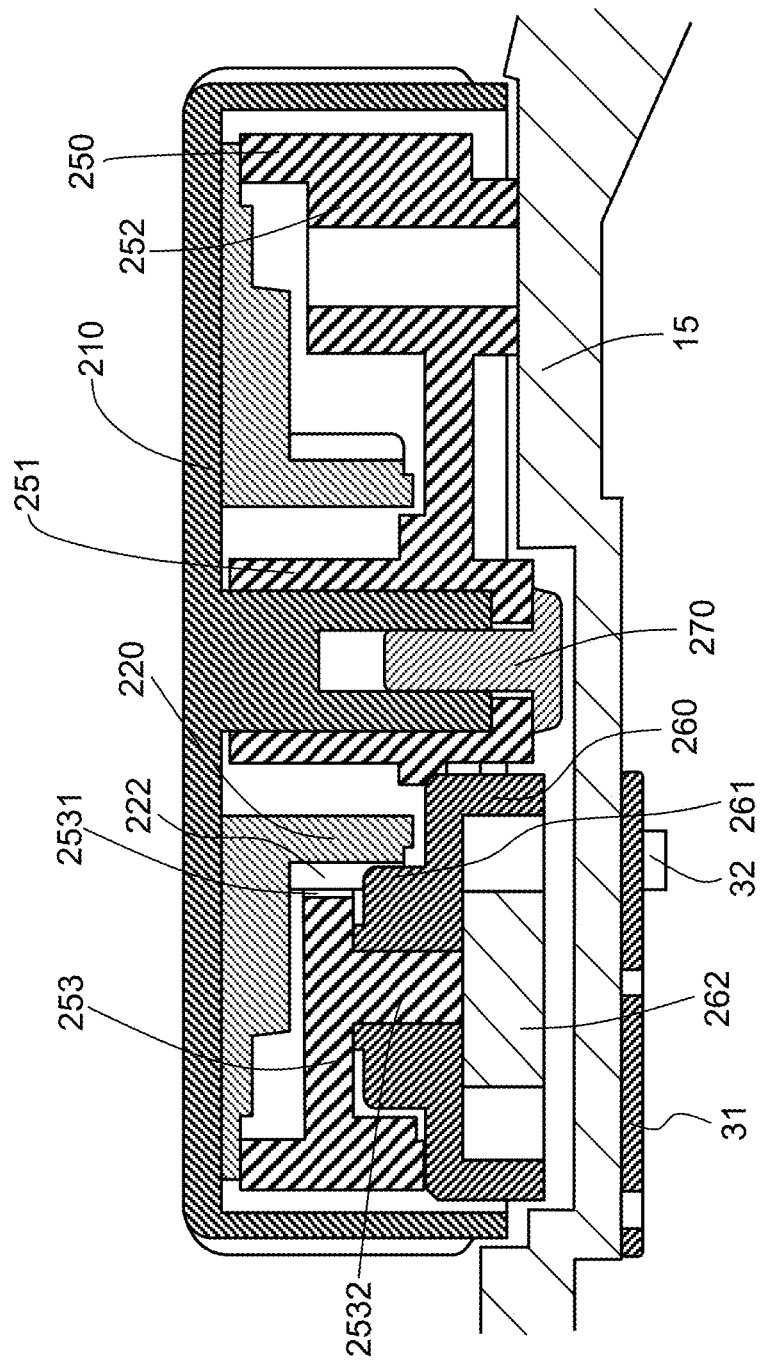
FIG. 11 is a cross-sectional view of a rotary dial apparatus according to a second exemplary embodiment.

FIG. 11 is a cross-sectional view of a rotary dial apparatus according to a second exemplary embodiment. In the present exemplary embodiment, the outside of case 15 is referred to as the camera exterior, and the inside of case 15 is referred to as the camera interior. Rotary dial unit 20 is disposed at the camera exterior. Rotation detector 30 is disposed at the camera interior. That is, part of case 15 functions as water shielding wall 42 according to the first exemplary embodiment. With case 15 being interposed, rotary dial unit 20 is disposed at the camera exterior, and rotation detector 30 is disposed at the camera interior. Dial holder 250 is held by case 15 serving as the wall. Thus, rotation of dial holder 250 relative to case 15 is restricted. The other structure is similar to that in the first exemplary embodiment, and therefore the description is not repeated.

2-2. Operation and Effect

Rotation detector 30 that requires electrical connection is disposed at the camera interior with case 15 being interposed. This makes it possible to prevent intrusion of water on the conductive portion of rotation detector 30, whereby drip-proof performance of the rotary dial apparatus provided to the digital camera improves.

3. OTHER EXEMPLARY EMBODIMENTS

In the foregoing, the first and second exemplary embodiments have been described as examples of the technique of the present disclosure. However, the technique of the present disclosure is not limited thereto, and can be applied to any exemplary embodiments having undergone modification, replacement, addition, or omission. Further, a new exemplary embodiment can be created by combining the constituent elements of the first and second exemplary embodiments described above. In the following, other exemplary embodiments are shown by way of illustration.

In the first and second exemplary embodiments, two magnetic sensors 32 are used. However, the present disclosure is not limited thereto. Rotation detection of rotary dial unit 20 through use of at least one magnetic sensor may suffice, with modification of the gear ratio and the magnetic sensor as appropriate.

In the first and second exemplary embodiments, the gear ratio between first gear 222 and second gear 261 is 1:2. However, the present disclosure is not limited thereto. For example, rotation of dial 210 may be detected by 15 degrees by setting the gear ratio to 1:3. Alternatively, the acceleration mechanism may be dispensed with, and dial 210 and magnet 262 may rotate at the same speed.

In the first and second exemplary embodiments, magnetic sensors 32 is provided under magnet 262. However, the present disclosure is not limited thereto. For example, in the first exemplary embodiment, magnetic sensors 32 may be provided on water shielding wall 42, and magnet 262 may be provided at the position opposing to magnetic sensors 32. Further, the rotary dial apparatus may be disposed at the side surface of camera body 10, and magnet 262 and magnetic sensors 32 may be disposed in the horizontal direction. Further, the rotation detecting mechanism of the present disclosure may be applied to an external device such as a longitudinal grip attached to a digital camera.

In the first and second exemplary embodiments, the rotary dial apparatus is employed for the user to change the shutter speed, the aperture value and the like. However, the present disclosure is not limited thereto. The present disclosure is applicable to any operation system with which the user changes setting by rotary operations. Such an operation system may include a mode dial, a zoom lever and the like.

In the first and second exemplary embodiments, a digital camera in which an interchangeable lens is attached to camera body 10 has been shown as an example, and the description has been given of the rotary dial apparatus provided to the digital camera. However, the rotary dial apparatus of the present disclosure is also applicable to a digital camera with a built-in lens.

4. CONCLUSION

As has been described above, the rotary dial apparatus of the present disclosure is capable of preventing intrusion of water on a conductive portion, by storing rotation detector 30 that requires electrical connection in the camera interior. Further, the rotary dial apparatus of the present disclosure is capable of performing contactless rotation detection at high resolution, through use of the magnetic sensors being smaller in number than a rotary dial apparatus that includes a magnet integrally rotating with a dial.

The rotary dial apparatus of the present disclosure is applicable to a rotary dial such as an operation dial of a camera, a volume dial of an audio device and the like.

What is claimed is:

1. A rotary dial apparatus comprising:
    a housing;
    a dial being rotatably held relative to the housing;
    a magnet rotating in accordance with rotation of the dial;
    a magnetic sensor disposed in the housing and detecting rotation of the magnet;
    a first gear integrally rotating with the dial; and
    a second gear meshing with the first gear and being different from the first gear in a diameter, wherein
    the magnet and the magnetic sensor are disposed in different regions from each other with a wall being interposed between the magnet and the magnetic sensor, and
    the magnet integrally rotates with the second gear.

2. The rotary dial apparatus according to claim 1, wherein the housing has an opening, and
    the wall is held by the housing so as to form a certain space for the dial to be disposed, and so as to cover the opening.

3. The rotary dial apparatus according to claim 1, wherein the wall is held by the housing via an elastic member.

4. The rotary dial apparatus according to claim 1, wherein the second gear is smaller than the first gear in the diameter.

5. The rotary dial apparatus according to claim 1, wherein the wall is part of the housing.

6. An imaging apparatus main body or an imaging apparatus comprising the rotary dial apparatus according to claim 1.

* * * * *